(12) United States Patent
Brandes (10) Patent No.: US 8,643,283 B2
(45) Date of Patent: Feb. 4, 2014

(54) ELECTRONIC DEVICE INCLUDING CIRCUITRY COMPRISING OPEN FAILURE-SUSCEPTIBLE COMPONENTS, AND OPEN FAILURE-ACTUATED ANTI-FUSE PATHWAY

(75) Inventor: George R. Brandes, Raleigh, NC (US)

(73) Assignee: Cree, Inc., Durham, NC (US)

( * ) Notice: Subject to any disclaimer, the term of this patent is extended or adjusted under 35 U.S.C. 154(b) by 347 days.

(21) Appl. No.: 12/325,214

(22) Filed: Nov. 30, 2008

(65) Prior Publication Data
US 2010/0134176 A1   Jun. 3, 2010

(51) Int. Cl.
*H05B 37/00* (2006.01)

(52) U.S. Cl.
USPC .................. 315/122; 315/185 R; 315/192

(58) Field of Classification Search
USPC .......... 315/129–132, 185 S, 185 R, 192, 122, 315/82; 362/543, 545, 565, 568, 612, 800; 307/36, 37
See application file for complete search history.

(56) References Cited

U.S. PATENT DOCUMENTS

| | | | |
|---|---|---|---|
| 3,254,334 A * | 5/1966 | Mitchell ........................ 340/511 |
| 4,132,925 A | 1/1979 | Schmutzer et al. |
| 4,451,767 A | 5/1984 | Goralnik |
| 4,666,252 A * | 5/1987 | Yaniv et al. ...................... 349/54 |
| 5,329,153 A * | 7/1994 | Dixit ............................. 257/530 |
| 5,661,374 A | 8/1997 | Cassidy et al. |
| 5,726,484 A | 3/1998 | Hart et al. |
| 5,914,501 A | 6/1999 | Antle et al. |
| 5,939,839 A | 8/1999 | Robel et al. |
| 6,153,980 A | 11/2000 | Marshall et al. |
| 6,349,023 B1 | 2/2002 | Greenberg |
| 6,628,491 B1 | 9/2003 | Tihanyi et al. |
| 6,657,841 B1 | 12/2003 | Melchert et al. |
| 6,926,524 B2 | 8/2005 | Cao |
| 7,732,942 B2 * | 6/2010 | Janning ....................... 315/185 S |
| 2002/0043943 A1 * | 4/2002 | Menzer et al. ............ 315/185 R |

(Continued)

FOREIGN PATENT DOCUMENTS

| | | |
|---|---|---|
| EP | 1526759 A2 | 4/2005 |
| JP | 2000-231363 A | 8/2000 |

(Continued)

OTHER PUBLICATIONS

Benedetto, J. et al., "Amorphorus Silicon Antifuse Programmable-Array-Logic Devices for High Reliability Space Applications", "UTMC Microelectronic Systems", 1997, pp. 1-4.

(Continued)

*Primary Examiner* — Tung X Le
(74) *Attorney, Agent, or Firm* — Hultquist, PLLC; Steven J. Hultquist; Mary B. Grant (57) ABSTRACT

An electronic device including series-connected open failure-susceptible components and re-routing assemblies for directing current through an ancillary current path to maintain operability of the series array despite an open-failed component therein. The re-routing assembly can be constituted as an ancillary circuit containing a bypass control element arranged to maintain the ancillary circuit in a non-current flow condition when none of the open failure-susceptible components has experienced open failure, and to re-route current from a main circuit around an open-failed component therein and through the ancillary circuit and back to the main circuit, to bypass the open-failed component so that all non-failed series components of the main circuit remain operative when electrically energized.

23 Claims, 4 Drawing Sheets

(56) References Cited

U.S. PATENT DOCUMENTS

| | | |
|---|---|---|
| 2003/0122139 A1 | 7/2003 | Meng et al. |
| 2004/0012033 A1 | 1/2004 | Yoo |
| 2004/0021425 A1* | 2/2004 | Foust et al. ............... 315/169.3 |
| 2005/0167680 A1* | 8/2005 | Shei et al. ........................ 257/79 |
| 2005/0174473 A1 | 8/2005 | Morgan et al. |
| 2005/0243539 A1 | 11/2005 | Evans et al. |
| 2006/0002187 A1* | 1/2006 | Forbes ..................... 365/185.01 |
| 2006/0220585 A1 | 10/2006 | Negley et al. |
| 2007/0030611 A1 | 2/2007 | Cho et al. |
| 2007/0108843 A1 | 5/2007 | Preston et al. |
| 2007/0131945 A1* | 6/2007 | Lin et al. ......................... 257/81 |
| 2007/0188113 A1 | 8/2007 | Okamoto |
| 2007/0221943 A1 | 9/2007 | Moriya et al. |
| 2007/0258176 A1* | 11/2007 | Ball et al. ........................ 361/56 |
| 2007/0279812 A1* | 12/2007 | Sasaki ................................ 361/1 |
| 2008/0007885 A1* | 1/2008 | Mehrl et al. .................. 361/104 |
| 2008/0101085 A1 | 5/2008 | Lin et al. |
| 2008/0231198 A1 | 9/2008 | Zarr |
| 2009/0021185 A1 | 1/2009 | Ng |
| 2009/0115703 A1 | 5/2009 | Cok |
| 2009/0189549 A1 | 7/2009 | Crawford et al. |
| 2009/0219460 A1* | 9/2009 | Takeda et al. .................... 349/61 |
| 2009/0284161 A1* | 11/2009 | Kumar et al. ............. 315/209 R |
| 2010/0027276 A1 | 2/2010 | Kornitz et al. |
| 2010/0084979 A1 | 4/2010 | Burton et al. |

FOREIGN PATENT DOCUMENTS

| | | |
|---|---|---|
| JP | 2002-9343 A | 1/2002 |
| JP | 2007-165161 * | 6/2007 |
| JP | 2007-200577 A | 8/2007 |
| JP | 2007-305512 A | 11/2007 |
| KR | 20-0306797 Y1 | 3/2003 |
| KR | 200070006073 A | 1/2007 |
| KR | 10-0863294 B1 | 10/2008 |
| KR | 100863294 B1 | 10/2008 |
| WO | 2005055379 A1 | 6/2005 |

OTHER PUBLICATIONS

Chiang, S. et al., "Antifuse Structure Comparison for Field Programmable Gate Arrays", "IEDM", 1992, pp. 2461-2464, vol. 612, No. 4.

Gordon, K. et al., "Conducting Filament of the Programmed Metal Electrode Amorphous Silicon Antifuse", "IEDM", 1993, pp. 261-264.

Hamdy, E. et al., "Dielectric Based Antifuse for Logic and Memory ICs.", "IEDM", 1988, pp. 786-789.

Renesas Technology Corp., "Zener Diodes for LED Protection", "http://www.renesas.com/en/diode", Jun. 2006, p. 1.

Wikipedia, "Antifuse", "http://en.wikipedia.org/wiki/Antifuse", Jun. 28, 2008, Publisher: Wikipedia Foundation Inc.; p. 2.

Zhang, G. et al., "An Electro-Thermal Model for Metal-Oxide-Metal Antifuses", "IEEE Transactions on Electron Devices", Aug. 1995, pp. 1548-1554, vol. 42, No. 8.

Brandes, G.,"LED Thermal Management System and Method", Co-Pending Unpublished U.S. Appl. No. 12/325,208, filed Nov. 30, 2008.

\* cited by examiner

ELECTRONIC DEVICE INCLUDING CIRCUITRY COMPRISING OPEN FAILURE-SUSCEPTIBLE COMPONENTS, AND OPEN FAILURE-ACTUATED ANTI-FUSE PATHWAY

FIELD OF THE INVENTION

The present invention relates to electronic devices including circuitry comprising open failure-susceptible components, and more specifically to devices of such type that contain open failure-actuated elements that function to maintain operability of the device under open failure conditions.

DESCRIPTION OF THE RELATED ART

For reasons of cost and efficiency, it is advantageous to operate LEDs in series. However, when LEDs are in series, an electronic device containing multiple LEDs will be rendered incapable of operation if a single LED component fails by going into an open state. Thus, the significant advantages that are achievable by series-arrangement of multiple LEDs reside in a device configuration that is susceptible to multiple open failure modes.

It would therefore be a substantial advance in the art to provide a multi-LED device in which LED components are arranged in series to achieve the aforementioned advantages, but in which the device does not experience total failure when a single LED in a series array experiences open state failure.

SUMMARY OF THE INVENTION

The present invention relates to microelectronic devices including a plurality of device components susceptible to open failure, in a series array.

In one aspect, the invention relates to an electronic device comprising:
a plurality of open failure-susceptible components joined in series relationship to one another in a main circuit; and
an ancillary circuit containing a bypass control element arranged to maintain the ancillary circuit in a non-current flow condition when none of the open failure-susceptible components has experienced open failure, and to reroute current from the main circuit around an open-failed component through the ancillary circuit and back to the main circuit, to bypass the open-failed component so that all non-failed series components of the main circuit remain operative when electrically energized.

In another aspect, the invention relates to a method of maintaining operability of a series-connected array of microelectronic components susceptible to open state failure in a main circuit, comprising re-routing of current around an open state failed component in said array through an ancillary circuit containing a bypass control element arranged to maintain the ancillary circuit in a non-current flow condition when none of the open failure-susceptible components has experienced open failure, and to reroute current from the main circuit around the open-failed component through the ancillary circuit and back to the main circuit, to bypass the open-failed component so that all non-failed series components of the main circuit remain operative when electrically energized.

The invention in one aspect relates to an electronic device, including series-connected open failure-susceptible components in a main circuit, and open failure-actuated current flow components that in the event of open failure are actuated to effect current flow around an open failed component to the main circuit to continue operation of non-failed components in the series array.

Another aspect of the invention relates to an anti-fuse assembly, comprising:
a substrate;
a first metal layer on the substrate;
a layer of actuating material on the metal layer, optionally with a silicon layer therebetween; and
a second metal layer on the actuating material layer,
wherein the actuating material layer will enable current flow through the anti-fuse assembly upon exposure to a predetermined anti-fuse electrical actuation condition.

The invention in a further aspect relates to an electronic device, comprising:
a series-connected array of open failure-susceptible electronic components; and
a plurality of anti-fuse assemblies, each of which is coupled to a respective one of the electronic components in a series-connected array, wherein each anti-fuse assembly includes an actuating material layer in contact with each of at least two conductive elements that do not contact one another, wherein the actuating material layer under non-open failure electrical conditions of operation of said failure-susceptible electronic components does not conduct current between said at least two conductive elements, and wherein the actuating material layer under open failure electrical conditions of operation of said failure-susceptible electronic components conducts current between said at least two conductive elements, to bypass an open failed component of said series-connected array of open failure-susceptible electronic components.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention relates to electronic devices including series-arranged circuitry components that are susceptible to open failure in use, and specifically to devices of such type that incorporate open failure-adaptive circuit arrangements that maintain operational continuity of the device in the event of open failure of series-connected components.

While the invention is applicable to any of a wide variety of microelectronic device components adapted for use in a series array and susceptible to component failure by passing into an open state, the invention is primarily described hereinafter in reference to series arrays of LED components. It will be understood, however, that the various approaches and techniques utilized for maintaining operational continuity of the illustrative series-connected LEDs may be correspondingly implemented and applied with other series-connectable, open state failure-susceptible microelectronic device components, including switches and optical components other than LEDs.

The microelectronic devices of the invention include series-connected open failure-susceptible components in a main circuit, and open failure-actuated current flow components, e.g., varistors, avalanche diodes, transient-suppression gas tubes, or antifuse components, that in the event of an open failure are actuated to effect current flow around an open failed component to the main circuit containing the other non-failed components of the series array. For such purpose, the open failure-actuated current flow components may be arranged in an auxiliary circuit, with each open failure-actuated current flow component being arranged across a corresponding open failure-susceptible component so that open failure of the component results in flow of the current around the open-failed component, through the open failure-actuated current flow component in the auxiliary circuit, and back to the main circuit.

The current re-routing components and arrangements utilized in the practice of the present invention present an alternative to the four-layer current shunting devices described in US Patent Application Publication 20060220585 of Negley et al.

Figure 1:
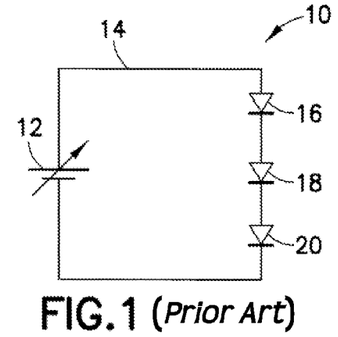
FIG. 1 is a schematic representation of a multiple LED circuit including series-connected LEDs.

Referring now to the drawings, FIG. 1 is a schematic representation of a multiple LED circuit 10 including series-connected LEDs 16, 18 and 20 connected by the circuit line 14 to the power supply 12. In this multiple LED circuit, an open failure by any one of the LEDs will result in total circuit failure.

Figure 2:
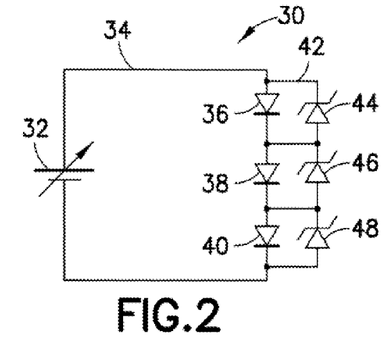
FIG. 2 is a schematic representation of a multiple LED circuit including series-connected LEDs, each of which has a Zener diode arranged across it, to provide a re-routing path when an LED in the series fails in an open state.

FIG. 2 is a schematic representation of a multiple LED circuit 30 including series-connected LEDs 36, 38 and 40, each of which has a Zener diode 44, 46 and 48, respectively, arranged across it, to provide a re-routing path when an LED in the series fails in an open state. The LEDs 36, 38 and 40 are series-connected and joined by circuit line 34 with the power supply 32. The Zener diodes are provided in an ancillary circuit comprising circuit line 42, with branch lines to the main circuit line 34, so that each Zener diode is arranged across a respective LED to provide a re-routing path for current around such LED, in the event of open failure of that LED.

The Zener diode utilized for such re-routing circuit of necessity has a breakdown voltage greater than that of the LED. For example, the Zener diode may have a breakdown voltage greater than 3.25 V, in a specific embodiment of the invention. Zener diodes are highly advantageous as re-routing components due to their low cost, in application to series arrays of LED components that are driven by direct current power supplies. Although Zener diodes have been used in association with LEDs as protective devices against electrostatic discharge, such elements have not to my knowledge been used as current re-routing devices to ensure operational continuity of series-connected LEDs in the event of open failure of an LED in the series. One exemplary Zener diode that may be used as a current re-routing component in accordance with the invention is commercially available from Renesas Technology Corp. (URL: http://www.renesas.com/en/diode) as Part No. RKZ6.2KL/HZL6.8Z4.

Figure 3:
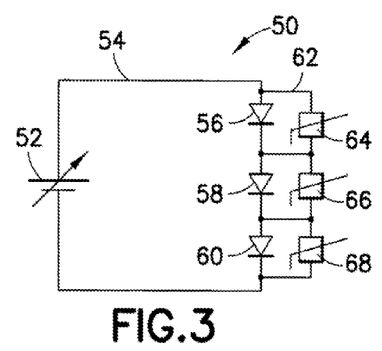
FIG. 3 is a schematic representation of a multiple LED circuit including series-connected LEDs, each of which has a multistage varistor arranged across it, to provide a re-routing path when an LED in the series fails in an open state.

FIG. 3 is a schematic representation of a multiple LED circuit 50 including series-connected LEDs 56, 58 and 60, each of which has a multistage varistor 64, 66 and 68, respectively, arranged across it, to provide a re-routing path when an LED in the series fails in an open state. The LEDs are arranged in series in a primary circuit path 54, coupled with power supply 52. The multistage varistors are arranged in series with one another in ancillary circuit path 62, with branch lines between successive varistors connecting the ancillary circuit path 62 and the primary circuit path 54, so that current is shunted through a respective multistage varistor when one of the LEDs fails in an open state. In such manner, the open state-failed LED is bypassed, and current is re-routed around the failed LED through the varistor.

It is to be understood that the design of the circuit is such that voltage and current limitations of the LEDs are not exceeded during operation when the bypass component is actuated for re-routing of current.

Multistage varistors are useful current re-routing components for series-connected open failure-susceptible components that are driven by alternating current sources. Exemplary varistor diodes that may be used as a current re-routing component in accordance with the invention are commercially available from TYEE Products Inc. (URL: http://www.tyeeusa.com) as Part No. 05D180K and from TDK, Inc. (URL http://roots.tdk.cojp/) as Part No. AVRM0603C6R8NT101N.

Figure 4:
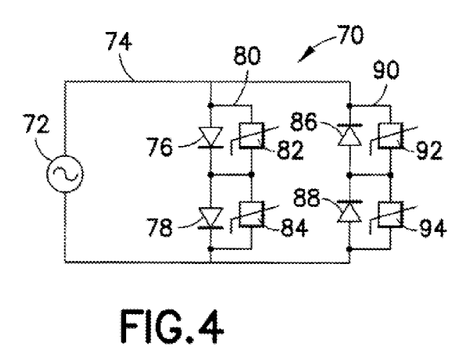
FIG. 4 is a schematic representation of a multiple LED circuit including parallel arrays of series-connected LEDs, in which each LED as a multistage varistor arranged across it, to provide a re-routing path when an LED in a series fails in an open state.

FIG. 4 is a schematic representation of a multiple LED circuit 70 including parallel arrays of series-connected LEDs, in which each LED as a multistage varistor arranged across it, to provide a re-routing path when an LED in a series fails in an open state. The primary circuit path 74 includes a first series array including LEDs 76 and 78, and a second series array including LEDs 86 and 88, arranged as illustrated, with a power supply 72 arranged to energize the respective LEDs. Each of the LEDs 76 and 78 in the first array is associated with multistage varistors 82 and 84 in an ancillary current path 80, so that each LED has a multistage varistor across it. For such purpose, the primary circuit path 74 and ancillary circuit path 80 are interconnected with one another by a branch line between the respective multistage varistors and the LEDs. It is to be understood that the circuit design is such that voltage and current limitations of the LEDs are not exceeded during operation when the varistor is actuated as a bypass control element in the current re-routing bypass circuitry.

In like manner, each of the LEDs 86 and 88 in the second array is associated with an ancillary current path 90 having multistage varistors 92 and 94 therein, with a branch line interconnecting the main circuit path and ancillary circuit path between the respective varistors and LEDs, so that current can flow around LED 86 or LED 88 in the event of an open state failure thereof.

The invention in one aspect relates to an electronic device, including series-connected open failure-susceptible components in a main circuit, and open failure-actuated current flow components that in the event of open failure are actuated to effect current flow around an open failed component to the main circuit to continue operation of non-failed components in the series array.

The series-connected open failure-susceptible components in such device can comprise series-connected LEDs.

Open failure-actuated current flow components in such device can comprise at least one component selected from the group consisting of Zener diodes, varistors, avalanche diodes, transient-suppression gas tubes, and antifuse assemblies.

The open failure-actuated current flow components are advantageously arranged in an auxiliary circuit, with each open failure-actuated current flow component being arranged across a corresponding open failure-susceptible component so that open failure of the component results in flow of the current around the open-failed component, through the open failure-actuated current flow component in the auxiliary circuit, and back to the main circuit.

Such electronic device in one embodiment is devoid of four-layer current shunting devices. In another embodiment, the open failure-actuated current flow component comprises a Zener diode having a breakdown voltage greater than 3.25 V.

Another embodiment of the invention relates to an anti-fuse assembly, comprising:
a substrate;
a first metal layer on the substrate;
a layer of actuating material on the metal layer, optionally with a silicon layer therebetween; and
a second metal layer on the actuating material layer,
wherein the actuating material layer will enable current flow through the anti-fuse assembly upon exposure to a predetermined anti-fuse electrical actuation condition.

In one embodiment of this anti-fuse assembly, the first and second metal layers are connected to terminals of an electronic device susceptible to open failure generating the aforementioned predetermined anti-fuse electrical actuation condition.

The optional silicon layer may be present as a separate layer formed on the metal layer, with the layer of actuating material being formed on the silicon layer. Alternatively, the actuating material layer may comprise a silicon sub-layer or the actuating material layer may contain silicon as a component material thereof.

The electronic device in the anti-fuse assembly can comprise a series-connected LED of an LED array, or other series-connected failure-susceptible component.

The actuating material in the anti-fuse assembly may be of any suitable type, and may for example include a material selected from the group consisting of silicon, silicon dioxide, amorphous silicon hydride, amorphous silicon carbide, germanium, amorphous compounds without hydrogen, and hydrogenated amorphous carbon.

In one embodiment of such anti-fuse assembly, the actuating material layer is selected to alloy with the second metal layer and/or the silicon layer (when the silicon layer is present), to enable current flow through the anti-fuse assembly upon exposure to the anti-fuse electrical actuation condition.

The invention in a further aspect relates to an electronic device, comprising:
a series-connected array of open failure-susceptible electronic components; and
a plurality of anti-fuse assemblies, each of which is coupled to a respective one of the electronic components in a series-connected array, wherein each anti-fuse assembly includes an actuating material layer in contact with each of at least two conductive elements that do not contact one another, wherein the actuating material layer under non-open failure electrical conditions of operation of said failure-susceptible electronic components does not conduct current between said at least two conductive elements, and wherein the actuating material layer under open failure electrical conditions of operation of said failure-susceptible electronic components conducts current between said at least two conductive elements, to bypass an open failed component of said series-connected array of open failure-susceptible electronic components.

The actuating material layer in such device may include a material selected from the group consisting of silicon, silicon dioxide, amorphous silicon hydride, amorphous silicon carbide, germanium, amorphous compounds without hydrogen, and hydrided amorphous carbon. The open failure-susceptible electronic components may be LEDs or other electronic components that are susceptible to open failure.

Figure 5:
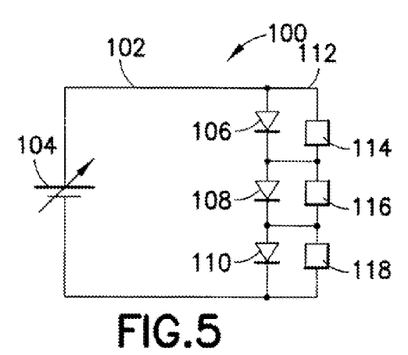
FIG. 5 is a schematic representation of a multiple LED circuit including series-connected LEDs, each of which has an antifuse assembly arranged across it, to provide a re-routing path when an LED in the series fails in an open state.

FIG. 5 is a schematic representation of a multiple LED circuit 100 including a circuit path 102 containing a power supply 104 and series-connected LEDs 106, 108 and 110, each of which has an antifuse assembly 114, 116 and 118 arranged across it, respectively, to provide a re-routing path when an LED in the series fails in an open state. The antifuse assemblies 114, 116 and 118 are arranged with branches between successive pairs of antifuse assemblies interconnecting the circuit path containing the antifuse assemblies and the circuit path containing the LEDs, so that each LED in the event of open state failure will be isolated, by current flow through the associated antifuse assembly, to bypass the failed LED. It is understood that the design of the circuit is such that voltage and current limitations of the LEDs are not exceeded during operation when the antifuse is actuated.

By way of example, an antifuse assembly can be provided as an integrated circuit chip of appropriate character. The antifuse assembly can alternatively be incorporated in the design of a ceramic board, for use in AC or DC designs.

The antifuse component may comprise an antifuse layer having an appropriate thickness and areal extent to conduct current through the auxiliary circuit current shunt path in the event of an open failure of a series-connected LED in a main circuit.

Figure 6:
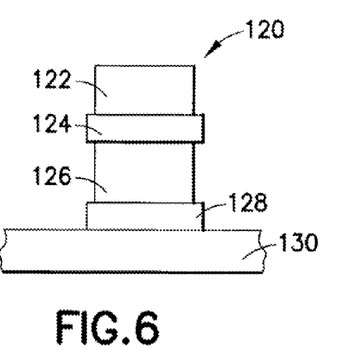
FIG. 6 is a schematic representation of an antifuse assembly, of a type that may be used in the FIG. 5 multiple LED circuit.

FIG. 6 is a schematic representation of an antifuse assembly 120, of a type that may be used in the FIG. 5 multiple LED circuit. The antifuse assembly is shown as including a substrate 130, which may for example comprise a module board or an electronic device foundation or other substrate article, on which is formed a contact layer or trace 128 that is typically formed from a metal. Optionally deposited on the metal trace 128 is a silicon layer 126, it being understood that the silicon layer may be absent, depending on the characteristics of the actuating layer 124, so that the actuating layer may be deposited directly on the metal trace 128. The actuating layer 124 is formed of suitable actuating material, e.g., insulating material, semi-insulating material or highly resistive material that is responsive to open circuit failure conditions to alloy with or otherwise transition to conductive interaction with the top contact layer 122, also typically formed from metal.

The metal trace 128 and metal layer 122 of the antifuse assembly 120 may be wire-bonded to terminals of the LED device, or connected in other manner to the LED to provide a configuration as schematically shown in FIG. 5.

In the operation of the antifuse assembly shown in FIG. 6, when the associated LED has failed in an open state, and correspondingly increased voltage (and ultimately current) are applied to the metal trace 128 and top layer 122, the actuating layer 124 will responsively break down and/or change state (e.g., alloying with the metal and silicon layer when present) to enable current to flow through the antifuse assembly, and around the associated failed LED connected to the metal trace 128 and top metal layer 122. Alternatively, the actuating layer may be selected so that it retains its discrete character and does not alloy or diffuse into the metal and/or silicon layers, but instead at the increased current and voltage conditions incident to the open failure of the associated LED, enables current to flow through the antifuse assembly, so that current is re-routed around the failed LED, to maintain the operation (light generation) of the remaining LEDs in the series array.

The antifuse (actuating) layer in such arrangements may be formed of any suitable material. In specific embodiments, the antifuse layer may comprise silicon, silicon dioxide, silicon nitride, amorphous silicon hydride, amorphous silicon carbide, hydrogenated amorphous carbon, etc. In some situations, for example when the antifuse layer area is large, it may be advantageous to utilize a multilayer stack such as, for example, an oxide and nitride stack, in the antifuse structure.

Figure 7:
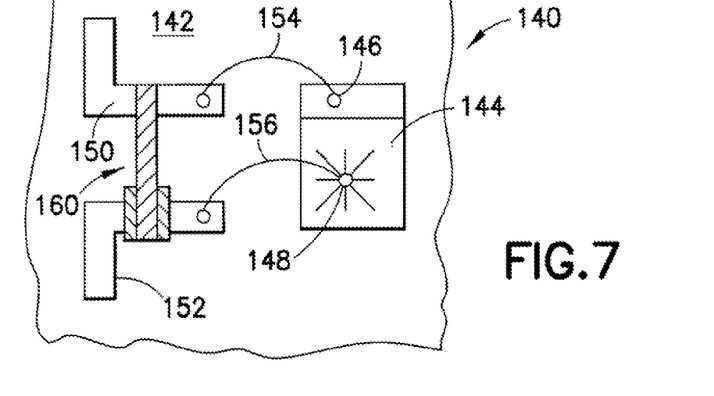
FIG. 7 is a schematic representation of an LED device structure on a substrate, in which top contacts of the LED device are wire-bonded to an antifuse assembly.

FIG. 7 is a schematic representation of an LED device structure 140 on a substrate 142 such as a module board, in which contacts 146, 148 of the LED device 144 are wire-bonded by wire bonds 154 and 156 to metal traces 150 and 152 to which an antifuse assembly 160 is also electrically connected. The structure of the antifuse assembly will be more fully appreciated by reference to the illustrative fabrication sequence for such assembly described below.

Figure 8:
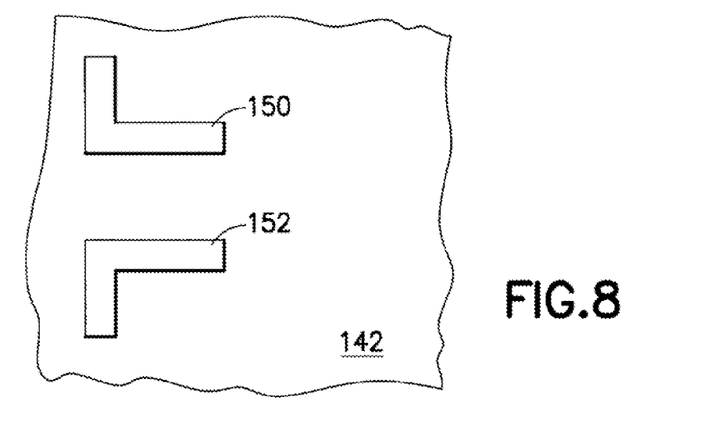
FIGS. 8-10 schematically represent a sequence of fabrication steps for forming the antifuse assembly of FIG. 7.
Figure 9:
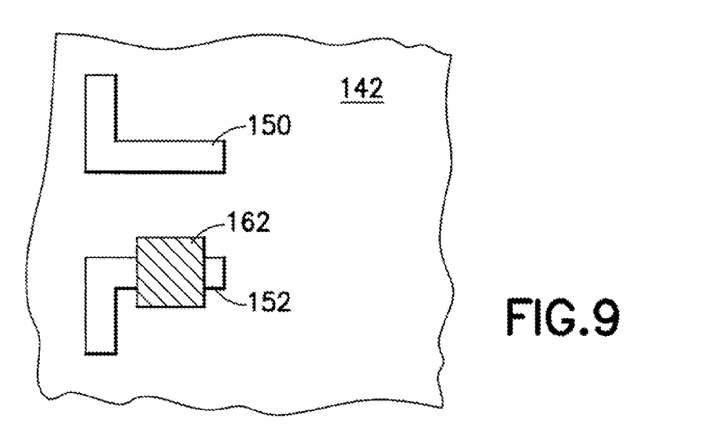
Figure 10:
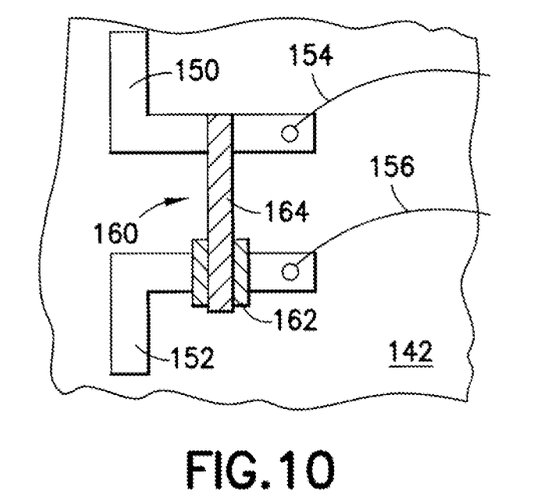

FIGS. 8-10 schematically represent an illustrative sequence of fabrication steps for forming the antifuse assembly 160 of FIG. 7.

FIG. 8 shows the associated portion of the substrate 142 on which the metal traces 150, 152 are initially formed. The metal traces may be formed on a 500 micron thick ceramic substrate comprising alumina that has been fired and polished to a smooth surface finish and may be a single metal layer or a metal stack that includes layers that provide different material properties, such as a layer to enhance adhesion to the ceramic (e.g., titanium), a layer to provide high electrical conductivity (e.g., copper or silver), and/or a layer that provides reduced reactivity (e.g., gold). The metal traces may be about 100-150 microns wide and about 50 to 100 microns thick, although the traces may be substantially smaller or larger depending upon circuit demands and space and materials constraints. The metal traces may be polished prior to deposition of the antifuse layer to provide a flat surface for the antifuse layer. Alternately, the metal traces may be shaped to enhance or facilitate actuation; for example, an array of cones may be formed prior to deposition of a thick antifuse layer, as one example.

In a second fabrication step, an antifuse material 162 such as amorphous silicon hydride or silicon dioxide ($SiO_2$) is deposited on metal trace 152, to yield the structure shown in FIG. 9. The thickness and area of the antifuse layer may be adjusted to provide for specific antifuse properties. For example, the thickness of the antifuse layer may be increased to yield reduced breakdown current and an increased voltage minimum for actuation. As a specific example, if silicon dioxide is used, the thickness of the layer might range from about 5 nm to about 15 nm or even as high as 100 nm. Similarly, dissimilar materials may be stacked to accomplish decreased leakage current, increased breakdown voltage and improved reliability. The area of the antifuse layer may be reduced to provide improved reliability or increased to provide for reduced resistance once the antifuse has been activated. Thereafter, an additional metal trace 164 is deposited, to overlie the antifuse layer 162 at one end portion of the additional metal trace, and at its opposite end portion to repose on metal trace 150. In such manner, the base metal traces 150 and 152 are spanned by the antifuse metal trace 164, with the antifuse metal trace 164 being in electrical contact with base metal trace 150, but being electrically isolated from contact with base metal trace 152.

In the operation of the antifuse assembly of FIG. 10, the increased voltage and ultimately current (once activation of the antifuse layer has begun) applied to the assembly upon occurrence of an open failure of an LED connected to the antifuse assembly by the wire bonds 154 and 156 will cause the antifuse layer 162 to provide electrical contact between the antifuse metal trace 164 and the base metal trace 152, as previously described. In such manner, current will flow through the respective electrical traces 150, 164 and 152 to enable bypass of the failed LED. It is apparent that the LED failure may occur not only from a failure of the LED chip, but also due to failure of the LED wire bonds 154 or 156 or the LED trace.

Figure 11:
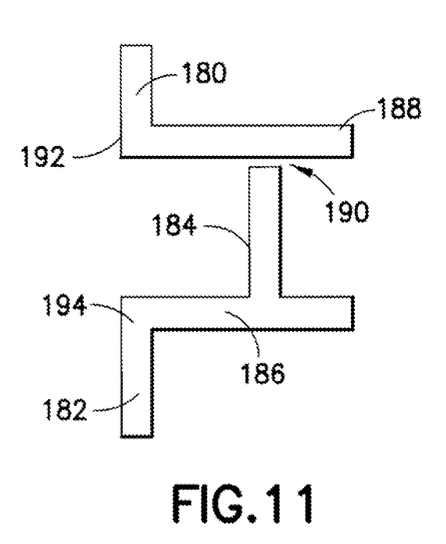
FIGS. 11-12 schematically illustrate another fabrication sequence for forming an antifuse assembly, of a type that may be used in the FIG. 5 LED circuit.
Figure 12:
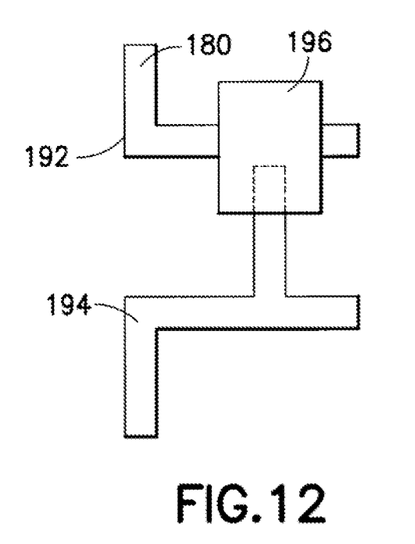

FIGS. 11-12 schematically illustrate another fabrication sequence for forming an antifuse assembly, of a type that may be used in the FIG. 5 LED circuit.

As shown in FIG. 11, two metal traces 192 and 194 are provided. Metal trace 192 includes a leg portion 180 and a trunk portion 188. Metal trace 194 includes a leg portion 182, trunk portion 186, and yolk portion 184. The uttermost extremity of the yolk portion is in space-apart relationship to the trunk 188 of trace 192, forming a gap 190 therebetween, which may be of micron-scale dimensions.

The FIG. 11 assembly is shown in FIG. 12 as comprising an antifuse layer 196 overlying the trunk of trace 192 and end region of the yolk portion of trace 194, and filling the gap 190. The antifuse layer, under increased current and voltage conditions incident to open failure of a microelectronic device component coupled to the antifuse assembly, functions to provide current flow through traces 192 and 194. Such current flow may be effected through the antifuse layer 196 without physical change thereof, or the antifuse layer material may alloy, chemically react, change crystalline order or interact with the respective base metal traces to provide a correspondingly created current flow path between the base metal traces. If micron scale dimensional tolerance is difficult to hold, the separation between traces 192 and 194 may be increased and a metal layer may be made to overlie the antifuse layer 196, taking care to prevent direct shorting of the overlying metal layer to either trace 192 or 194.

It will be appreciated that any suitable antifuse layer material may be employed for such purpose, including single component materials as well as multicomponent materials, which in response to the conditions created by open failure of an associated series-connected component will support bypass flow of current through such material, as will be readily determinable by those of ordinary skill in the art, without undue experimentation, based on the disclosure herein.

Figure 13:
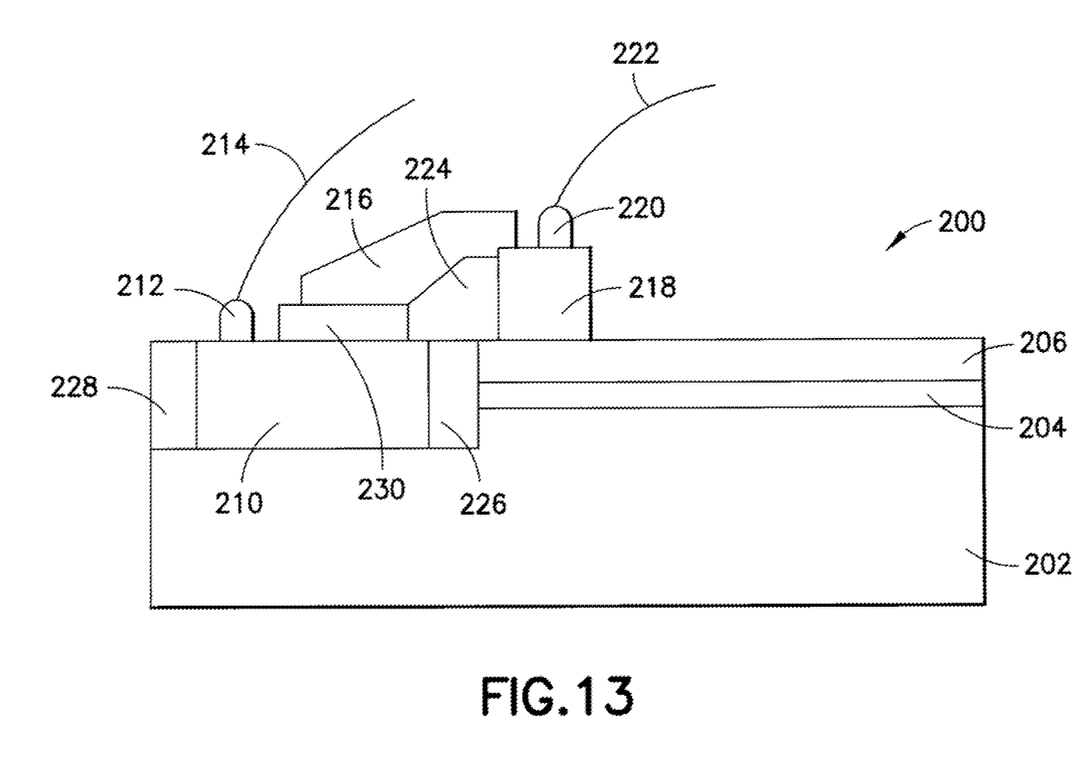
FIG. 13 is a cross-sectional elevation view of a microelectronic device structure including an LED and an antifuse assembly for operational management of the LED.

FIG. 13 is a cross-sectional elevation view of a microelectronic device structure 200 including an LED and an antifuse assembly.

The device structure 200 includes a substrate 202, which may be constituted by material such as n-type gallium nitride (GaN), on the upper surface of which has been formed an active InGaN layer 204, on top of which has been formed a p-type gallium nitride. On the lower surface of the gallium nitride base layer 202 is deposited a metal layer 210 on which is formed a wire bonding bump 212, to which wire bond 214 is connected. The metal layer 210 is flanked by deposited dielectric material 228 and 226. On the top surface of the metal layer 210, an antifuse layer 230 has been formed, adjacent deposited dielectric material 224. A metal layer 218 is deposited on a portion of the top surface of gallium nitride layer 206, and has a wire bonding bump 220 thereon, to which is coupled wire bond 222.

Overlying the antifuse layer 230, dielectric material 224 and metal layer 218 is an additional metal layer 216. Upon open failure of the gallium nitride LED device, the resultingly increased current and voltage causes the antifuse layer in interaction with the metal layers 210 and 216 to effect current flow therethrough. Such interaction may involve diffusional interaction with adjacent metal layers, chemical reaction to form a conductive reaction product, or other co-action producing a current flow through the antifuse assembly, to bypass the open failed component with which the antifuse assembly is associated.

The size of the antifuse element may be chosen to enable a predetermined voltage drop, and a minimum size of contact area may be required to enable high current, e.g., of 700 milliamps and above, to pass through the antifuse assembly.

As another option and alternative to the antifuse arrangement, programmable spare chips with backup series-connected microelectronic device components may be employed, so that power is redirected to the backup series components. As a further optional feature, a fuse component or current limiter may be integrated in the antifuse assembly, to protect the device when excessive current conditions are experienced.

A further embodiment of the invention relates to an antifuse multi-LED circuit or other open failure-adaptive multi-LED circuit of the invention, which is devoid of gate oscillator components and/or Zener diode components.

Another embodiment of the invention relates to an open failure-adaptive circuit that is devoid of any redundant connection arrangement of LEDs, i.e., wherein each of multiple LEDs in an array is concurrently joined in both series and parallel arrangement, with at least one other series-connected LED and with at least one other parallel-connected LED in the array, so that any open failure of a single LED in the array will result in the remaining LEDs continuing to be operational.

In a further embodiment, a current re-routing assembly may be formed on a module, as an integrated varactor. Other open failure re-routing devices may include avalanche diodes that are responsive to the failure conditions to effect re-routing of current around the open-failed component.

The invention in another aspect relates to an open failure-adaptive circuit that is devoid of any redundant connection arrangement of LEDs, i.e., arrangements in which each of multiple LEDs in an array is concurrently joined in both series and parallel arrangement, with at least one other series-connected LED and with at least one other parallel-connected LED in the array, so that any open failure of a single LED in the array will result in the remaining LEDs continuing to be operational.

The LEDs utilized in open failure-adaptive circuits of the present invention utilize commercially available LEDs in simple and effective circuits that realize the substantial advantages of series arrangement of LEDs and remain operational even when individual LED components in the series experience open failure.

The open failure-adaptive circuits of the present invention in various embodiments can utilize a number of shunt auxiliary circuit arrangements in which the shunt circuit path contains a current flow component, such as a varistor (e.g., a metal oxide varistor), an avalanche diode, a transient-suppression gas tube, or other component that acts to effect current flow through the shunt circuit path in the event of an open failure of an associated LED in a main circuit series arrangement.

The electronic device of the invention, including series-connected open failure-susceptible components in a main circuit, and open failure-actuated current flow components that in the event of open failure are actuated to effect current flow around an open failed component to the main circuit to continue operation of non-failed components in the series array, can be of any suitable type. For example, the electronic device may be an illumination article, such as an interior lighting article, an automotive illumination unit, string lighting, or an emergency egress lighting system, or a cell phone with an LED-based LCD backlighting system, a flat-panel display, consumer appliance, such as an appliance with an LED indicator light strip, etc.

It will be recognized that open failure-adaptive multi-LED circuits of the present invention may in various embodiments utilize specific parts and components of circuit assemblies herein described, and that in further varied embodiments, the inventive circuitry and devices containing same may alternatively comprise, consists or consists essentially of specific parts, components, elements and features taken from other embodiments and aspects of the invention. The invention therefore is to be regarded as being susceptible of constitution with varied permutations and combinations of specific parts, components, elements and features herein disclosed, in particular embodiments thereof.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. An electronic device comprising:
   a plurality of open failure-susceptible components joined in series relationship to one another in a main circuit; and
   an ancillary circuit containing a bypass control element arranged to maintain the ancillary circuit in a non-current flow condition when none of the open failure-susceptible components has experienced open failure, and to reroute current from the main circuit around an open-failed component through the ancillary circuit and back to the main circuit in the event of an open failure to bypass the open-failed component so that all non-failed series components of the main circuit remain operative when electrically energized, wherein the bypass control element includes an anti-fuse assembly that includes at least one anti-fuse layer positioned over a first metal contact, wherein the first metal contact is positioned adjacent to a second metal contact on a first surface of a substrate and separated from the second metal contact by a gap along the first surface of the substrate, wherein a third metal contact is physically connected to the at least one anti-fuse layer and is electrically isolated from the first metal contact by the at least one anti-fuse layer and is electrically connected with the second metal contact, wherein the at least one anti-fuse layer comprises a material configured to at least one of alloy with, diffuse into, and chemically react with at least one of the first metal contact and the third metal contact to form one of a conductive alloy and a conductive reaction product to enable current flow from the first metal contact through the at least one anti-fuse layer to the second metal contact across the gap via the third metal contact under said open failure conditions.

2. The electronic device of claim 1, wherein said components comprise light emitting diodes ("LEDs").

3. The electronic device of claim 1, wherein the first metal contact and the second metal contact comprise metal traces on the first surface of substrate.

4. The electronic device of claim 1, wherein the at least one anti-fuse layer comprises silicon.

5. The electronic device of claim 1, wherein the at least one anti-fuse layer comprises one or more of silicon dioxide, silicon nitride, amorphous silicon hydride, amorphous silicon carbide, and hydrogenated amorphous carbon.

6. The electronic device of claim 1, wherein the at least one anti-fuse layer comprises an oxide layer and a nitride layer.

7. The electronic device of claim 1, wherein the at least one anti-fuse layer comprises a non-dielectric material including one of an insulating material and a highly resistive material.

8. The electronic device of claim 1, wherein opposite terminals of at least one of the plurality of open failure-susceptible components are joined to the first metal contact and the second metal contact of the bypass control element via wire bonds.

9. A method of maintaining operability of a series-connected array of microelectronic components susceptible to open state failure in a main circuit, comprising re-routing of current around an open state failed component in said array through metal contacts electrically coupled to opposite terminals of the open state failed component, wherein the metal contacts include a first metal contact and a second metal contact separated by a gap, wherein the gap is spanned by a third metal contact extending between the first metal contact and the second metal contact, wherein the third metal contact is physically coupled to the first metal contact via at least one anti-fuse layer that electrically insulates the first metal contact from the third metal contact prior to the open state failure of the open state failed component and the third metal contact is physically and electrically coupled to the second metal contact, and applying the current to the anti-fuse layer as a result of the open state failure of the open state failed component causing the current to flow between the first metal contact and the second metal contact via the third metal contact, wherein the at least one anti-fuse layer comprises a non-dielectric material configured to form a shunt between the first metal contact and the third metal contact to reroute current from the main circuit around the open-failed component so that all non-failed series components of the main circuit remain operative when electrically energized.

10. The method of claim 9, wherein said components comprise light emitting diodes ("LEDs").

11. The method of claim 9, wherein the first metal contact and the second metal contact comprise metal traces on a first surface of a substrate.

12. The method of claim 9, wherein the non-dielectric material of the at least one anti-fuse layer comprises one of an insulating material and a highly resistive material.

13. The method of claim 9, wherein the first metal contact and the second metal contact are positioned adjacent to each other on a first surface of a substrate and the gap separating the first metal contact and the second metal contact is across the first surface of the substrate.

14. The method of claim 9, wherein the opposite terminals of the open state failed component are joined to the first metal contact and the second metal contact via wire bonds.

15. An anti-fuse assembly, comprising:
a first metal trace formed on a first surface of a substrate;
a second metal trace formed on the first surface of a substrate adjacent to the first metal trace, and wherein the first metal trace and the second metal trace are separated by a gap across the first surface of the substrate; and
one or more anti-fuse layers including a layer of actuating material bridging the gap across the first surface of the substrate between the first metal trace and the second metal trace, wherein in response to application of a current resulting from an open failure of a microelectronic component electrically coupled in parallel to the first metal trace and the second metal trace, the layer of actuating material is configured to at least one of alloy with, diffuse into, and chemically react with at least one of another of the one or more anti-fuse layers and one or more of the first metal trace and the second metal trace to form one of a conductive alloy and a conductive reaction product to enable current flow therethrough to circumvent the microelectronic component.

16. The anti-fuse assembly of claim 15, wherein said electronic device comprises a series-connected LED of an LED array.

17. The anti-fuse assembly of claim 15, wherein the actuating material comprises a material selected from the group consisting of silicon, silicon dioxide, amorphous silicon hydride, amorphous silicon carbide, and hydrogenated amorphous carbon.

18. The anti-fuse assembly of claim 15, wherein the actuating material comprises amorphous silicon or silicon dioxide.

19. The anti-fuse assembly of claim 15, wherein the layer of actuating material comprises a non-dielectric material including one of an insulating material and a highly resistive material.

20. The anti-fuse assembly of claim 15, wherein the first metal trace and the second metal trace are configured to be connected to opposite terminals of the microelectronic component via wire bonds.

21. An electronic device comprising:
a plurality of open failure-susceptible components joined in series relationship to one another in a main circuit; and
an ancillary circuit containing a bypass control element arranged to maintain the ancillary circuit in a non-current flow condition when none of the open failure-susceptible components has experienced open failure, and to reroute current from the main circuit around an open-failed component through the ancillary circuit and back to the main circuit in the event of an open failure to bypass the open-failed component so that all non-failed series components of the main circuit remain operative when electrically energized, wherein the bypass control element includes an anti-fuse assembly that includes at least one anti-fuse layer positioned over a first metal contact, wherein the first metal contact is positioned adjacent to a second metal contact on a first surface of a substrate and separated from the second metal contact by a gap along the first surface of the substrate, wherein a third metal contact is physically connected to the at least one anti-fuse layer and is electrically isolated from the first metal contact by the at least one anti-fuse layer and is electrically connected with the second metal contact, wherein the at least one anti-fuse layer comprises a material configured to at least one of alloy with, diffuse into, and chemically react with at least one of the first metal contact and the third metal contact to form one of a conductive alloy and a conductive reaction product to enable current flow from the first metal contact through the at least one anti-fuse layer to the second metal contact across the gap via the third metal contact under said open failure conditions, wherein each of the first metal contact and the second metal contact includes a leg portion and a trunk portion, wherein the trunk portion is arranged at an angle to the leg portion, and wherein the gap along the first surface of the substrate between the first metal contact and a second metal contact is between the trunk portion of the first metal contact and the trunk portion of the second metal contact.

22. A method of maintaining operability of a series-connected array of microelectronic components susceptible to open state failure in a main circuit, comprising re-routing of current around an open state failed component in said array through metal contacts electrically coupled to opposite terminals of the open state failed component, wherein the metal contacts include a first metal contact and a second metal contact separated by a gap, wherein the gap is spanned by a third metal contact extending between the first metal contact and the second metal contact, wherein the third metal contact is physically coupled to the first metal contact via at least one anti-fuse layer that electrically insulates the first metal contact from the third metal contact prior to the open state failure of the open state failed component and the third metal contact is physically and electrically coupled to the second metal contact, and applying the current to the anti-fuse layer as a result of the open state failure of the open state failed component causing the current to flow between the first metal contact and the second metal contact via the third metal contact, wherein the at least one anti-fuse layer comprises a non-dielectric material configured a shunt between the first metal contact and the third metal contact to reroute current from the main circuit around the open-failed component so that all non-failed series components of the main circuit remain operative when electrically energized, wherein the first metal contact and the second metal contact are positioned adjacent to each other on a first surface of a substrate and the gap separating the first metal contact and the second metal contact is across the first surface of the substrate, wherein each of the first metal contact and the second metal contact includes a leg portion and a trunk portion, wherein the trunk portion is arranged at an angle to the leg portion, and wherein the gap along the first surface of the substrate between the first metal contact and a second metal contact is between the trunk portion of the first metal contact and the trunk portion of the second metal.

23. An anti-fuse assembly, comprising:
a first metal trace formed on a first surface of a substrate;
a second metal trace formed on the first surface of a substrate adjacent to the first metal trace, and wherein the first metal trace and the second metal trace are separated by a gap across the first surface of the substrate; and
one or more anti-fuse layers including a layer of actuating material bridging the gap across the first surface of the substrate between the first metal trace and the second metal trace, wherein in response to application of a current resulting from an open failure of a microelectronic component electrically coupled in parallel to the first metal trace and the second metal trace, the layer of actuating material is configured to at least one of alloy with, diffuse into, and chemically react with at least one of another of the one or more anti-fuse layers and one or more of the first metal trace and the second metal trace to form one of a conductive alloy and a conductive reaction product to enable current flow therethrough to circumvent the microelectronic component, wherein:
the first metal trace includes a first leg portion and a first trunk portion arranged at an angle to the first leg portion; and
the second metal trace includes a second leg portion, a second trunk portion arranged at an angle to the second leg portion, and a yolk portion extending from the second trunk portion toward the first trunk portion of the first metal trace,
wherein the gap separating the first metal trace and the second metal trace across the first surface of the substrate is between the first trunk portion of the first metal trace and the yolk portion of the second metal trace.

* * * * *